April 10, 1962
R. E. LESLIE ETAL
3,029,392
WIDE-RANGE PULSE AMPLITUDE LIMITER HAVING MEANS FOR BY-PASSING SOME OF CASCADED LIMITER STAGES
Filed Nov. 10, 1959
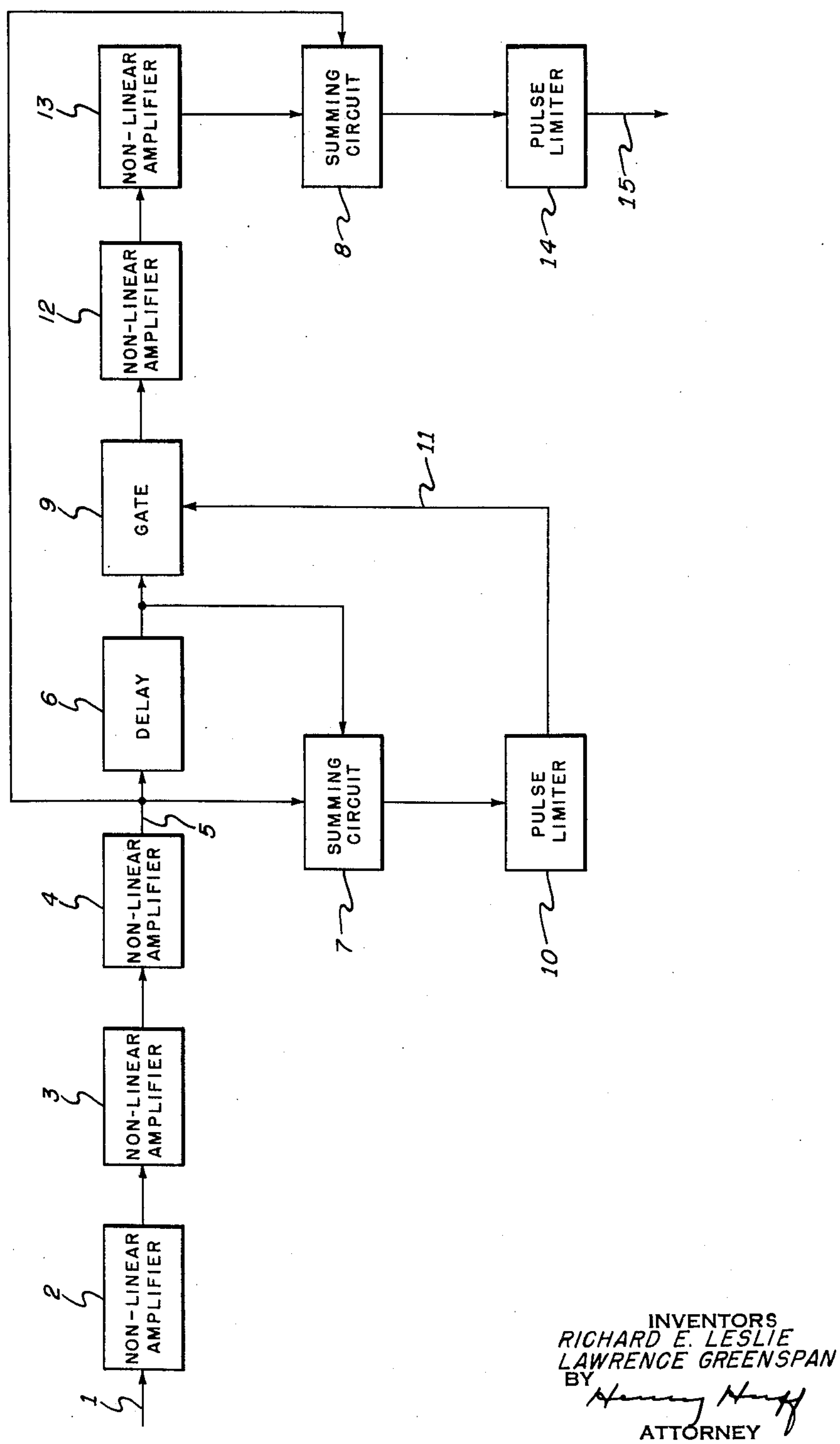
INVENTORS
RICHARD E. LESLIE
LAWRENCE GREENSPAN
BY
ATTORNEY

United States Patent Office 3,029,392

Patented Apr. 10, 1962

3,029,392

WIDE-RANGE PULSE AMPLITUDE LIMITER HAVING MEANS FOR BY-PASSING SOME OF CASCADED LIMITER STAGES

Richard E. Leslie, East Northport, N.Y., and Lawrence E. Greenspan, Nashua, N.H., assignors to Sperry Rand Corporation, Great Neck, N.Y., a corporation of Delaware

Filed Nov. 10, 1959, Ser. No. 852,140
4 Claims. (Cl. 328—169)

The present invention relates to a pulse amplitude limiting system and, more particularly, to means for producing an output pulse having a predetermined amplitude and a duration equal to that of an applied input pulse over a wide dynamic range of input pulse values.

In certain types of microwave pulsed signal transponder systems, it is desired that the pulse transmitted in response to a received pulse be of the same duration as that of the received pulse. At the same time it is important, of course, that the transponder power amplifier operate with continued maximum efficiency despite wide variations in the amplitudes of the received pulses. The latter consideration requires, where travelling wave tubes are employed as the transmitter power amplifier, that the modulating signal amplitude be maintained substantially constant. Pulsed travelling wave tubes are known to have relatively small voltage margins within which the amplitude of the modulating pulse must fall in order to attain maximum output peak power. Overdriving as well as underdriving the travelling wave tube would cause a reduction in said power output.

The foregoing pulse amplitude and duration requirements imposed on the travelling wave tube modulating signal suggest the use of a conventional pulse limiting circuit in the receiver of the transponder under consideration. Such a circuit ordinarily could be expected to produce, in response to received pulses, the required output pulse for modulating the transmitter travelling wave tube power amplifier. This expectation is not realized, however, when received pulses of wide dynamic range are applied to a conventional limiting circuit. Under such circumstances, which are routinely encountered in many microwave transponder applications, the output pulse produced by the limiting circuit becomes distorted both in amplitude and in duration when the higher input signals are applied. Because of feed-through, capacitor blocking and other effects, once the input signal to the conventional pulse limiter becomes roughly 25 to 35 db greater than the initial limiting threshold value, serious pulse width, pulse shape and pulse amplitude distortion begins to occur.

It is the principal object of the present invention to provide a pulse amplitude limiting means for the production of an output pulse having a predetermined amplitude and a duration equal to that of an applied input pulse.

Another object of the invention is to provide means for limiting the amplitude of an applied input pulse without introducing other distortion over a wide dynamic range of input pulse amplitudes.

These and other objects of the present invention, as will appear from a reading of the following specification, are accomplished in a preferred embodiment by the provision of first and second pulse amplifying means selectively connectable in cascade. Signal amplitude responsive means are provided at the output of the first amplifying means for selectively interconnecting the first and second pulse amplifying means. Signal summing means are also included for additively combining the output signals produced by the first and second pulse amplifying means. The resultant sum of the output signals is applied to the input of a conventional pulse limiting circuit. Depending upon the energization of the selective interconnecting means the resultant signal applied to the pulse limiting circuit may or may not include the signal contribution of the second amplifying means.

For a more complete understanding of the invention reference should be had to the following specification and to the drawing which is a simplified block diagram of a preferred embodiment.

Referring to the drawing, a pulsed signal is applied to input line 1. The applied pulse is amplified as desired, for example, by amplifiers 2, 3 and 4. Each of amplifiers 2, 3 and 4 preferably has a nonlinear gain versus signal amplitude characteristic whereby the dynamic range of the resultant pulses on line 5 is reduced with respect to that of the input pulses. The signal appearing on line 5 is applied jointly to delay means 6, and to summing circuits 7 and 8. Delay means 6 introduces a relatively short time delay in the signal applied via line 5 for proper operation of gate 9 as will be described later. Circuits 7 and 8 are conventional in design and serve to additively combine the two input signals respectively applied. The delayed signal at the output of delay means 6 is applied to a second input of summing circuit 7 as well as to the input to gate 9.

The resultant signal at the output of circuit 7 is applied to pulse limiter 10. Pulse limiter 10 may be of a conventional nature such as, for example, the Schmitt circuit described in Millman and Taub, "Pulse and Digital Circuits," McGraw-Hill, 1956, p. 164. As is well understood, a Schmitt circuit is essentially a two state switching device which remains in one stable state so long as the applied input signal is less in amplitude than a predetermined threshold value. When the input signal amplitude exceeds said value, the Schmitt circuit assumes the other of its two stable states until the input signal amplitude again falls below the threshold level. Each of the two stable states of limiter 10 are distinguished by a respective and predetermined amplitude signal which appears on output line 11. It will be recognized that limiter 10 inherently produces an output signal on line 11 having a predetermined amplitude in response to a signal at the output of circuit 7 having an amplitude exceeding the triggering threshold value. Furthermore, the duration of the pulsed signal on line 11 is substantially equal to the duration of the pulsed signal at the output of circuit 7.

Gate 9 normally is open or conducting; it remains so until the signal on line 11 assumes the one of its two predetermined amplitude values corresponding to the appearance of a pulse at the output of circuit 7 having an amplitude exceeding the aforementioned triggering threshold value of limiter 10. During the conduction of gate 9, the signal at the output of delay means 6 is applied to amplifier 12. The signal at the output of amplifier 12 is further amplified in amplifier 13 and then applied to the second input of summing circuit 8. Circuit 8, like circuit 7 previously described, additively combines the two input signals to produce an output signal having an amplitude proportional to the sum of the two input signal amplitudes. The signal at the output of circuit 8 is applied to and actuates pulse limiter 14. Limiter 14, like limiter 10, may comprise a standard Schmitt circuit. The output signal produced by limiter 14 is of a predetermined amplitude and of a duration substantially equal to the duration of the input signal applied via line 1 over wide dynamic range of input signal amplitude variation. The dynamic range in input signal amplitude permitted by the invention is substantially larger than that which would be feasible without undue signal distortion were simply a pulse limiter employed such as limiters 10 and 14.

In operation, the input signal applied via line 1 is amplified and, to some extent, compressed in dynamic range by the operation of nonlinear amplifiers 2, 3 and 4. Assuming that the level of the amplified signal appearing on line 5 is insufficient to actuate limiter 10, normally conducting gate 9 remains conductive and permits the signal to be further amplified in amplifiers 12 and 13. The totally amplified signal is then applied to and triggers pulse limiter 14 which, in turn, produces the output pulse of required amplitude and duration characteristic.

As the amplitude of the input signal on line 1 increases, and before distortion is produced at the output of limiter 14, the signal produced on line 5 will exceed the actuation threshold of limiter 10. Upon the actuation of limiter 10 and the consequent abrupt change in the voltage level of line 11, normally conductive gate 9 will be deactuated and rendered nonconductive. It will now be seen that the short delay introduced by delay means 6 permits the actuation of limiter 10 and the closing of normally open gate 9 before a pulse of excessive amplitude on line 5 would pass through. The pulses are said to be of excessive amplitude for the reason that if passed by gate 9 and further amplified by amplifiers 12 and 13, they would begin to cause distortion in pulse limiter 14 whereby the required amplitude and duration characteristics of the output pulse of line 15 would not be maintained.

The closure of gate 9 blocks but one of the two alternative signal paths which are combined in summing circuit 8. One path, namely, the one directly interconnecting the output of amplifier 4 and summing circuit 8, remains intact. Thus, the pulse of amplitude on line 5 sufficient to actuate limiter 10 is also sufficient when directly coupled by circuit 8 to limiter 14 to actuate limiter 14. In this manner, an input pulse applied via line 1 is alternatively amplified by the total gain of amplifiers 2, 3, 4, 12 and 13 or by the gain of only amplifiers 2, 3 and 4 depending upon whether the signal amplitude on line 5 is below or above, respectively, the actuation threshold of limiter 10. In either event, the signal amplitude at the output of summing circuit 8 is maintained below that level which would produce undesired distortion in limiter 14 over a substantially extended dynamic range of input signal amplitudes.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. Means for limiting the amplitudes of input pulses over a wide amplitude range, said means comprising first and second pulse amplifying means selectively connectable in cascade, means for selectively interconnecting, when actuated, the output of said first amplifying means and the input of said second amplifying means, means connected to said output of said first amplifying means for producing a control signal when the signal level at said output exceeds a predetermined value, means for applying said control signal to said means for selectively interconnecting for the deactuation thereof, signal summing means connected to said outputs of said first and second amplifying means, and pulse amplitude limiting means connected to the output of said signal summing means.

2. Apparatus as defined in claim 1 wherein said means for producing said control signal comprises a pulse delay means connected to the output of said first amplifying means, signal summing means connected to the outputs of said first amplifying means and said pulse delay means, and pulse amplitude limiting means connected to the output of said signal summing means.

3. Apparatus as defined in claim 2 wherein said selectively interconnecting means comprises electronic gating means connected between said output of said pulse delay means and said input of said second amplifying means, said gating means being deactuated in response to said control signal.

4. Apparatus as defined in claim 1 wherein said first and second amplifying means have non-linear gain versus signal amplitude characteristics.

References Cited in the file of this patent

UNITED STATES PATENTS

| | | |
|---|---|---|
| 2,654,833 | Lord | Oct. 6, 1953 |
| 2,914,666 | Derouet | Nov. 24, 1959 |